(12) United States Patent
Bryant et al.

(10) Patent No.: US 7,745,879 B2
(45) Date of Patent: Jun. 29, 2010

(54) METHOD OF FABRICATING HIGH VOLTAGE FULLY DEPLETED SOI TRANSISTOR AND STRUCTURE THEREOF

(75) Inventors: Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 11/872,953

(22) Filed: Oct. 16, 2007

(65) Prior Publication Data

US 2009/0096026 A1    Apr. 16, 2009

(51) Int. Cl.
*H01L 29/43* (2006.01)
*H01L 29/786* (2006.01)

(52) U.S. Cl. .............................. 257/348; 257/E29.151; 257/E29.273

(58) Field of Classification Search ................. 257/155, 257/348, 476, 483, 485, 486, E29.117, E29.151, 257/E29.271, E29.273, E29.281, E29.148
See application file for complete search history.

(56) References Cited

U.S. PATENT DOCUMENTS

| | | | |
|---|---|---|---|
| 6,413,829 B1 * | 7/2002 | Yu | 438/311 |
| 2003/0218193 A1 * | 11/2003 | Hayashi et al. | 257/288 |
| 2004/0014304 A1 * | 1/2004 | Bhattacharyya | 438/570 |
| 2007/0025034 A1 * | 2/2007 | Chaudhary et al. | 361/56 |

* cited by examiner

*Primary Examiner*—Sue Purvis
*Assistant Examiner*—Leslie Pilar Cruz
(74) *Attorney, Agent, or Firm*—Richard Kotulak Hoffman Warnick LLC

(57) ABSTRACT

A method of fabricating a high voltage fully depleted silicon-on-insulator (FD SOI) transistor, the FD SOI transistor having a structure including a region within a body on which a gate structure is disposed. The region includes a channel separating the source region and the drain region. Above the source region is disposed a carrier recombination element, which abuts the gate structure and is electrically connected to the region via the channel. The drain region is lightly doped and ballasted to increase breakdown voltage. The FD SOI may be fabricated by forming a body with a thin silicon layer disposed on a buried oxide (BOX). Alternatively, the body may be formed using a partially depleted (PD) SOI where the region formed therein has a reduced thickness in comparison to the overall thickness of the PD SOI.

4 Claims, 3 Drawing Sheets

US 7,745,879 B2

METHOD OF FABRICATING HIGH VOLTAGE FULLY DEPLETED SOI TRANSISTOR AND STRUCTURE THEREOF

BACKGROUND

1. Technical Field

The disclosure relates to a fully depleted silicon-on-insulator (FD SOI) metal oxide semiconductor field effect transistor (MOSFET) and the structure thereof. More particularly, the disclosure relates to fabrication of a FD SOI MOSFET incorporating carrier recombination elements.

2. Related Art

In the current state of the art, the demand for interface standards in high voltage devices/transistors has reached as high as 5V. Partially depleted (PD) silicon-on-insulator (SOI) currently used in the fabrication of metal oxide semiconductor field effect transistor (MOSFET) is not able to attain interfaces of this voltage range. The limiting factor lies with the floating body in the PD SOI, which with high voltage behaves like a bipolar transistor. When a bipolar transistor turns on, parasitic bipolar currents lead to breakdown at a high voltage, particularly in an n-type FET (NFET). To overcome this limitation, a source-body tie in the PD-SOI FET is used to increase the breakdown voltage. However, the increment of the breakdown voltage is by only a few tenths of a volt, which is too low to meet the demand for high performance interfaces and stacking of FETs.

In view of the foregoing, it is desirable to develop an alternative method for fabricating a high voltage SOI FET.

SUMMARY

A method of fabricating a high voltage fully depleted silicon-on-insulator (FD SOI) transistor, the FD SOI transistor having a structure including a region within a body on which a gate structure is disposed. The region includes a channel separating the source region and the drain region. Above the source region is disposed a carrier recombination element, which abuts the gate structure and is electrically connected to the region via the channel. The drain region is lightly doped and ballasted to increase breakdown voltage. The FD SOI may be fabricated by forming a body with a thin silicon layer disposed on a buried oxide (BOX). Alternatively, the body may be formed using a partially depleted (PD) SOI where the region formed therein has a reduced thickness in comparison to the overall thickness of the PD SOI.

A first aspect of the disclosure provides a high voltage fully depleted silicon-on-insulator (SOI) transistor comprising: a SOI layer, disposed on an oxide layer of a substrate, the SOI layer having a region including a source region and a ballasted drain region separated by a channel therein, and a gate structure disposed above the channel; and at least one carrier recombination element disposed above the source region and abutting the gate structure.

A second aspect of the disclosure provides a method of fabricating a high voltage fully depleted silicon-on-insulator (SOI) transistor, the method comprising: providing a thin SOI layer; forming a region within the thin SOI layer, the region including a channel separating a source region and drain region; ballasting the drain region to increase breakdown voltage; forming a gate structure over the channel; and forming at least one carrier recombination element above the source region, wherein the at least one recombination element abuts the gate structure.

A third aspect of the disclosure provides a method of fabricating a high voltage fully depleted silicon-on-insulator (SOI) transistor, the method comprising: providing a partially depleted (PD) SOI layer; forming a region within the PD SOI layer, wherein the region is of reduced thickness with respect to the PD SOI layer and is defined by a channel separating a source region and a drain region; forming a gate structure over the channel; ballasting the drain region to increase breakdown voltage; and forming at least one carrier recombination element above the source region, wherein the at least one carrier recombination element abuts the gate structure.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
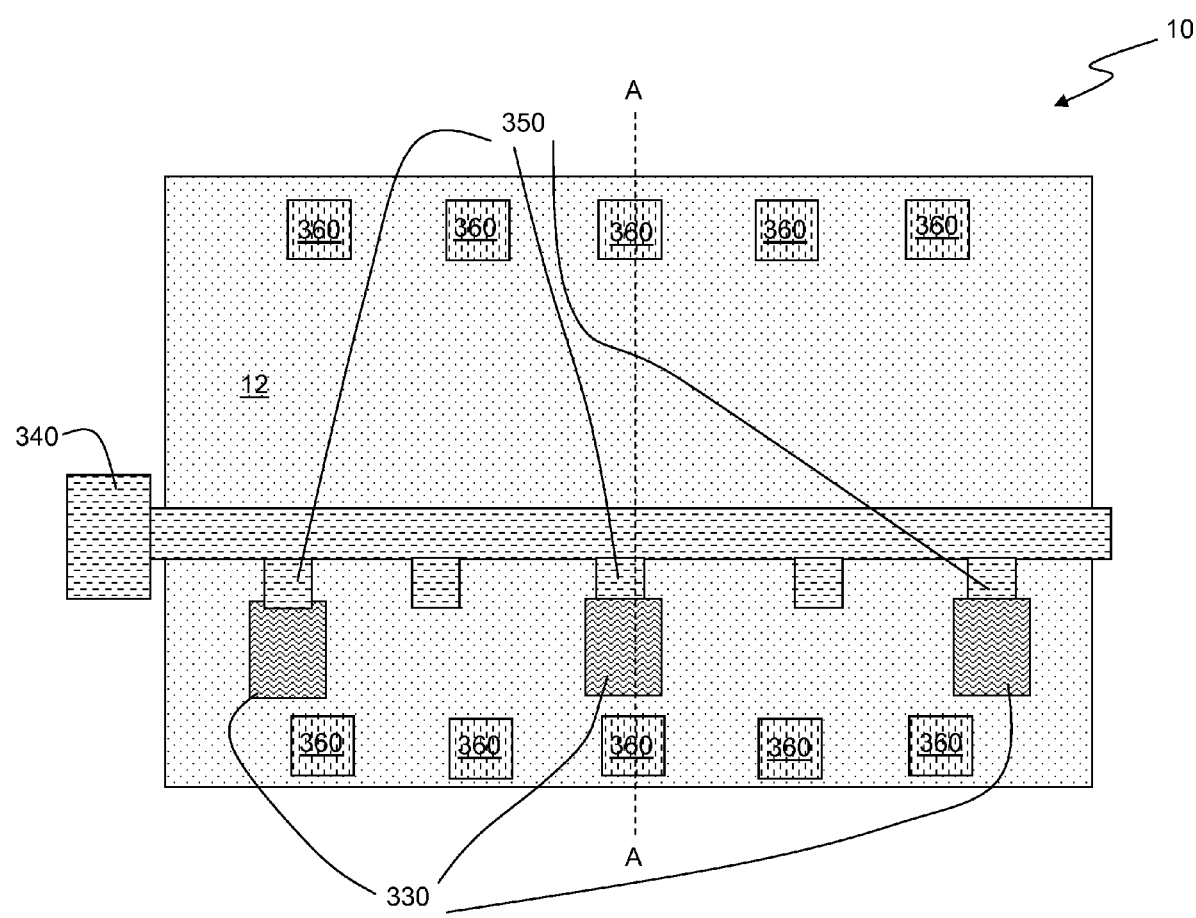
FIG. 1 illustrates a top view of an embodiment a FD SOI MOSFET.

The accompanying drawings are not to scale, and are incorporated to depict only typical aspects of the disclosure. Therefore, the drawings should not be construed in any manner that would be limiting to the scope of the invention. In the drawings, like numbering represents like elements between the drawings.

DETAILED DESCRIPTION

Figure 2:
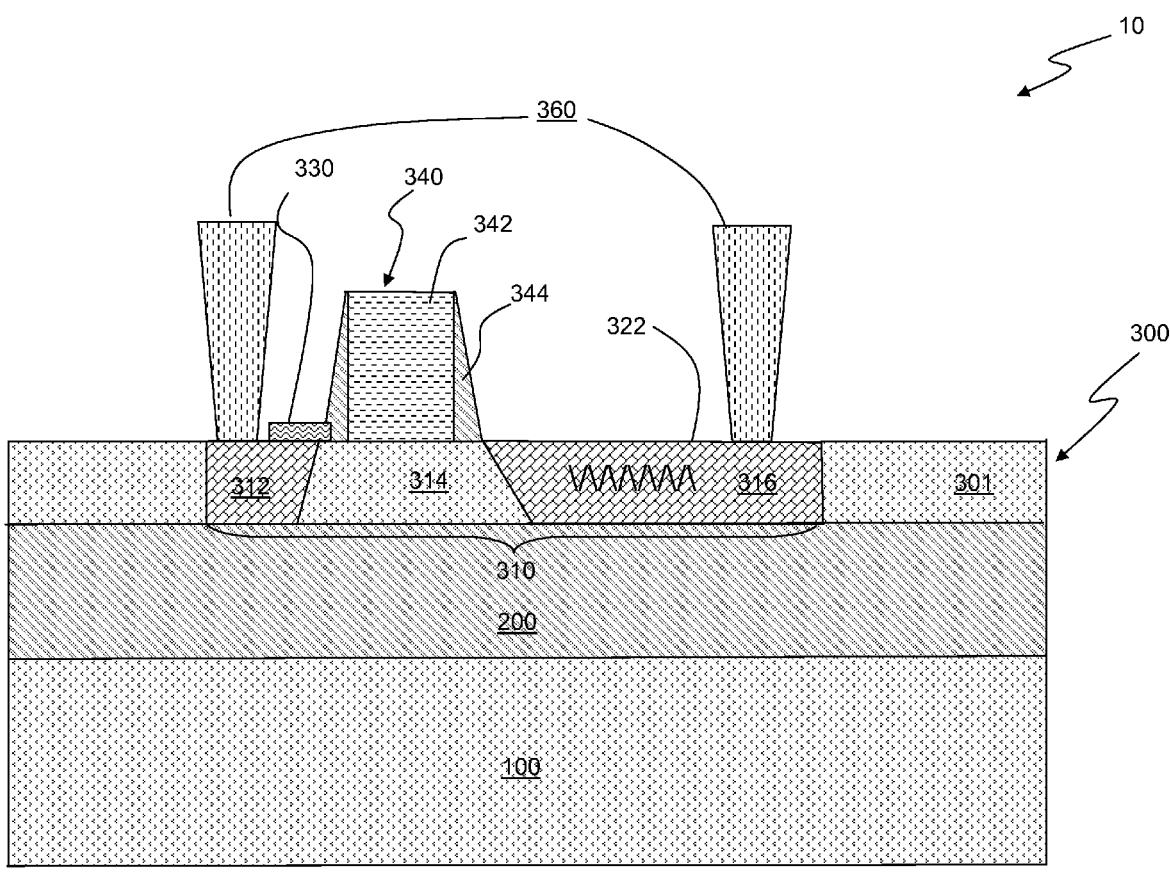
FIG. 2 illustrates a cross-sectional view of an embodiment of a FD SOI MOSFET.
Figure 3:
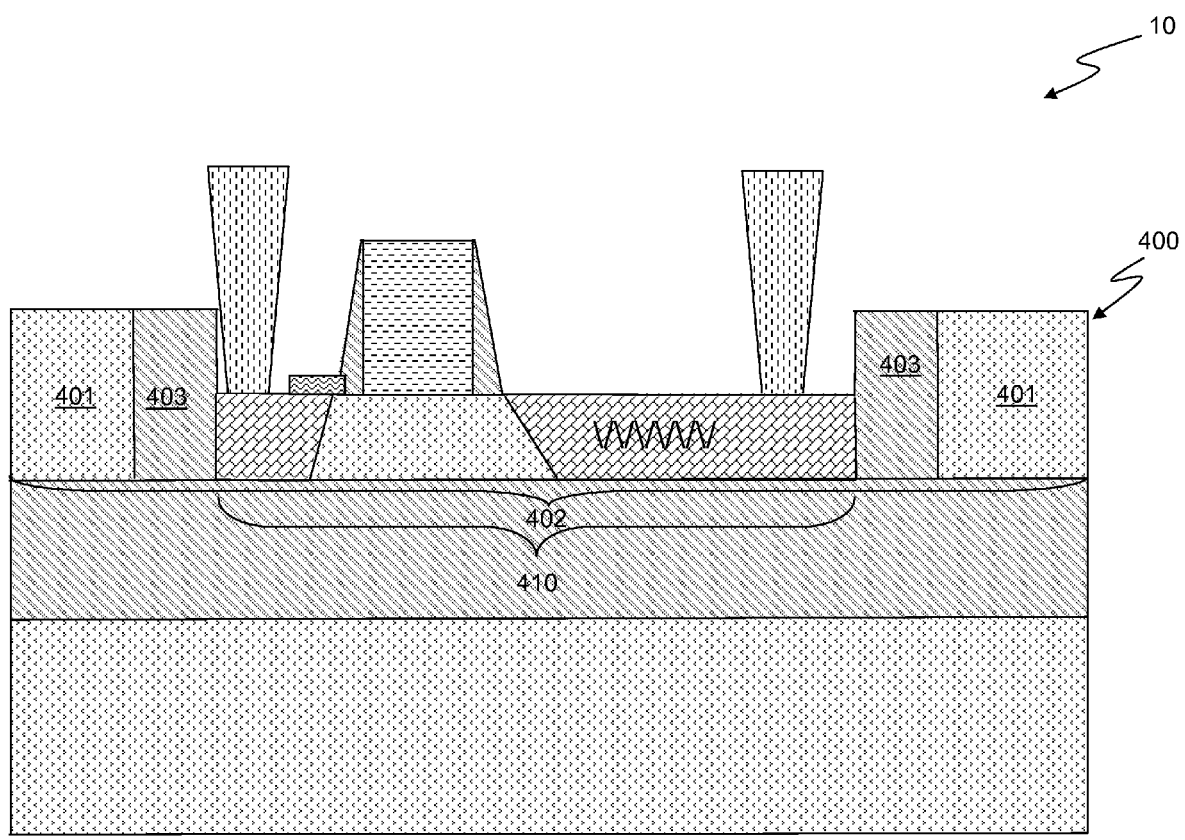
FIG. 3 illustrates a cross-sectional view of an embodiment of a FD SOI MOSFET fabricated with PD SOI.

Embodiments depicted in the drawings in FIGS. 1-3 illustrate different aspects of a fully depleted (FD) silicon-on-insulator (SOI) metal oxide semiconductor field effect transistor (MOSFET) 10 which is applicable to an n-type MOSFET (NFET) or a p-type MOSFET (PFET) or both.

FIG. 1 illustrates, in a top view, an exemplary embodiment of a FD SOI MOSFET 10 covered with a silicide layer 12. FD SOI MOSFET 10 includes a gate structure 340, which carrier recombination elements 330 abut at various sections 350. Carrier recombination element(s) 330 may also be referred to as carrier recombination centers. FD SOI MOSFET also includes features 360 disposed on region 310 (FIG. 2). Further details of the fabrication and structures of FD SOI MOSFET 10 are discussed with respect to FIG. 2 and FIG. 3 in the following paragraphs.

FIG. 2 illustrates the cross-sectional view of the FD SOI MOSFET 10 taken along the line A-A in FIG. 1. FD SOI MOSFET 10 includes a body 300, formed from a thin silicon film, for example, but is not limited to thin SOI layer 301, disposed on a buried oxide (BOX) 200. BOX 200 is disposed on a substrate 100 using currently known or later developed techniques. Body 300 may be formed by currently known or later developed fabrication techniques in the CMOS fabrication process. Thin silicon layer 301 for forming body 300 may be fully depleted by design. To achieve this, the silicon layer 301 may be doped and has a thickness that is, for example, inversely proportional to the degree of doping. The thickness for keeping the thin silicon layer 301 fully depleted may be, for example, but is not limited to approximately 300 Å or less. Within body 300 is defined region 310, which includes a channel 314, a source region 312 and a drain region 316. Channel 314, source region 312 and drain region 316 are formed by currently known or later developed techniques such that channel 314 separates source region 312 and drain region 316. Depending on whether a PFET or an NFET is desired, drain region 316 is doped with, but is not limited to, for example, boron, phosphorous, arsenic, germanium, or a combination thereof. Following doping, drain region 316 is ballasted, by currently known or later developed processes, such that a ballasted drain region 322 is formed to increase breakdown voltage. Gate structure 340, which includes a gate 342 and a spacer 344, is formed over channel 314 by currently known or later developed CMOS fabrication processes. Carrier recombination element(s) 330, for example, Schottky tabs, are then disposed over FD SOI region 310 to abut gate structure 340 using currently known or later developed fabrication techniques. Carrier recombination element(s) contact FD SOI region 310 physically and electrically through channel 314 to suppress minority carrier current preventing a parasitic bipolar effect during operation of the FD SOI MOSFET 10. Standard base oxide growth sequence and standard CMOS fabrication process follows after the formation of carrier recombination element(s) 330.

FIG. 3 illustrates an alternative embodiment of FD SOI MOSFET 10 where body 400 includes a partially depleted silicon-on-insulator (PD SOI) region 401 and a FD SOI region 410. In this alternative embodiment, FD SOI MOSFET 10 is fabricated by forming a FD SOI region 410 within body 400. Body 400 includes PD SOI region 401, insulating region 403 and FD SOI region 410. Body 400 is fabricated by currently known or later developed PD SOI techniques using complementary metal oxide semiconductor (CMOS) processes. FD SOI region 410 may be formed by isolating a region within body 400. For example, sacrificial oxide (SA-COX) growth/etch may be applied for isolating a region on PD SOI layer 402, followed by currently known or later developed photoresist-etching techniques to reduce thickness of PD SOI layer 402 to form FD SOI region 410. FD SOI region 410 so formed, includes source region 312 and a drain region 316, which are separated by a channel 314. FD SOI region 410 may be of a thickness no greater than approximately 300 Å, which is less than overall thickness of a remaining portion of PD SOI layer 402 (i.e., PD SOI region 401). Gate structure 340 is formed on region 410 over channel 314 by currently known or later developed techniques. Carrier recombination elements 330, for example Schottky tabs, are subsequently formed over source region 312 to abut gate structure 340. Carrier recombination elements 330 are electrically and physically connected to channel 314 in FD SOI region 410.

The foregoing description of various aspects of the invention has been presented for purposes of illustration and description. It is not intended to be exhaustive or to limit the scope of the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A high voltage fully depleted silicon-on-insulator (SOI) transistor, comprising:
    a SOI layer, disposed on an oxide layer of a substrate, the SOI layer having a region including a source region and a ballasted drain region separated by a channel therein;
    a gate structure disposed above the channel, wherein the gate structure comprises a gate and a spacer disposed on sidewalls of the gate; and
    at least one carrier recombination element disposed above the source region and abutting the gate structure, wherein the at least one carrier recombination element suppresses minority carrier current to prevent a parasitic bipolar effect from occurring during operation of the transistor, wherein the at least one carrier recombination element is physically and electrically connected to the channel, wherein the at least one carrier recombination element has a top surface having a portion embedded underneath the spacer disposed above the source region and a side surface disposed entirely against the spacer disposed above the source region.

2. The transistor of claim 1, wherein the region is of a reduced thickness with respect to a remaining portion of the SOI layer.

3. The transistor of claim 1, wherein the region is of a thickness of less than approximately 300 Å.

4. The transistor of claim 1, wherein the at least one carrier recombination element is a Schottky tab.

* * * * *